United States Patent
Bach et al.

(10) Patent No.: US 10,177,569 B2
(45) Date of Patent: Jan. 8, 2019

(54) SYSTEM AND METHOD FOR POWER SUPPLY RIPPLE COMPENSATION

(71) Applicant: Infineon Technologies AG, Neubiberg (DE)

(72) Inventors: Elmar Bach, Villach (AT); Benno Mühlbacher, St. Magdalen (AT); Andreas Wiesbauer, Pörtschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 282 days.

(21) Appl. No.: 15/279,048

(22) Filed: Sep. 28, 2016

(65) Prior Publication Data
US 2018/0090928 A1  Mar. 29, 2018

(51) Int. Cl.
| | |
|---|---|
| G05F 1/70 | (2006.01) |
| H02J 1/02 | (2006.01) |
| G01D 11/00 | (2006.01) |
| G01R 19/00 | (2006.01) |
| G11C 7/06 | (2006.01) |
| H02J 3/01 | (2006.01) |
| H02M 1/15 | (2006.01) |

(52) U.S. Cl.
CPC ............... H02J 1/02 (2013.01); G01D 11/00 (2013.01); G01R 19/0084 (2013.01); G11C 7/06 (2013.01); H02J 3/01 (2013.01); H02M 1/15 (2013.01)

(58) Field of Classification Search
CPC .... H02J 3/01; H02J 1/02; H02M 1/15; H02M 3/158; H02M 1/08; G11C 7/05; Y02B 70/14333
USPC ......... 323/205, 210, 211, 282–285; 327/156, 327/162; 363/16–17, 21.02, 21.04, 49, 363/56.01, 97, 98
See application file for complete search history.

(56) References Cited

U.S. PATENT DOCUMENTS

| | | | | |
|---|---|---|---|---|
| 7,050,312 | B2* | 5/2006 | Tracy | H02J 9/062 |
| | | | | 307/66 |
| 7,336,513 | B1* | 2/2008 | Chen | H02M 7/538 |
| | | | | 363/132 |
| 9,041,472 | B2* | 5/2015 | Chen | H03F 3/19 |
| | | | | 330/307 |
| 9,305,765 | B2* | 4/2016 | Goscha | H01J 61/56 |
| 2015/0035608 | A1* | 2/2015 | Miyashita | H03F 1/0233 |
| | | | | 330/297 |

* cited by examiner

Primary Examiner — Rajnikant Patel
(74) Attorney, Agent, or Firm — Slater Matsil, LLP

(57) ABSTRACT

According to an embodiment, a power compensation circuit is configured to be coupled to a power supply. The power compensation circuit includes a measurement circuit and a compensation circuit. The measurement circuit is configured to receive a power supply signal from the power supply, and determine a variation of the power supply signal. The compensation circuit is coupled to the measurement circuit and configured to generate a compensation power consumption based on the variation of the power supply signal, where the compensation power consumption is controlled inversely with the variation of the power supply signal.

23 Claims, 5 Drawing Sheets

SYSTEM AND METHOD FOR POWER SUPPLY RIPPLE COMPENSATION

TECHNICAL FIELD

The present invention relates generally to electronic circuits, and, in particular embodiments, to a system and method for power supply ripple compensation.

BACKGROUND

Transducers convert signals from one domain to another and are often used in sensors. One example of a common sensor that is seen in everyday life is a microphone that converts sound waves to electrical signals. Another example of a common sensor is a thermometer. Various transducers exist that serve as thermometers by transducing temperature signals into electrical signals.

Microelectromechanical systems (MEMS) based transducers include a family of transducers produced using micromachining techniques. MEMS, such as a MEMS microphone, gather information from the environment by measuring the change of physical state in the transducer and transferring a transduced signal to processing electronics that are connected to the MEMS transducer. MEMS devices may be manufactured using micromachining fabrication techniques similar to those used for integrated circuits.

MEMS devices may be designed to function as, for example, oscillators, resonators, accelerometers, gyroscopes, temperature sensors, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits.

MEMS based sensors are often used in mobile electronics, such as tablet computers or mobile phones. In some applications, it may be desirable to increase the functionality of these MEMS based sensors in order to provide additional or improved functionality to the electronic system including the MEMS based sensors, such as a tablet computer or mobile phone, for example. Thus, some systems include multiple MEMS based sensors and multiple functional components combined in a single system. The inclusion of multiple elements in a single system provides opportunity for inventive solutions to issues relevant to such multiple element systems.

SUMMARY

According to an embodiment, a power compensation circuit is configured to be coupled to a power supply. The power compensation circuit includes a measurement circuit and a compensation circuit. The measurement circuit is configured to receive a power supply signal from the power supply, and determine a variation of the power supply signal. The compensation circuit is coupled to the measurement circuit and configured to generate a compensation power consumption based on the variation of the power supply signal, where the compensation power consumption is controlled inversely with the variation of the power supply signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
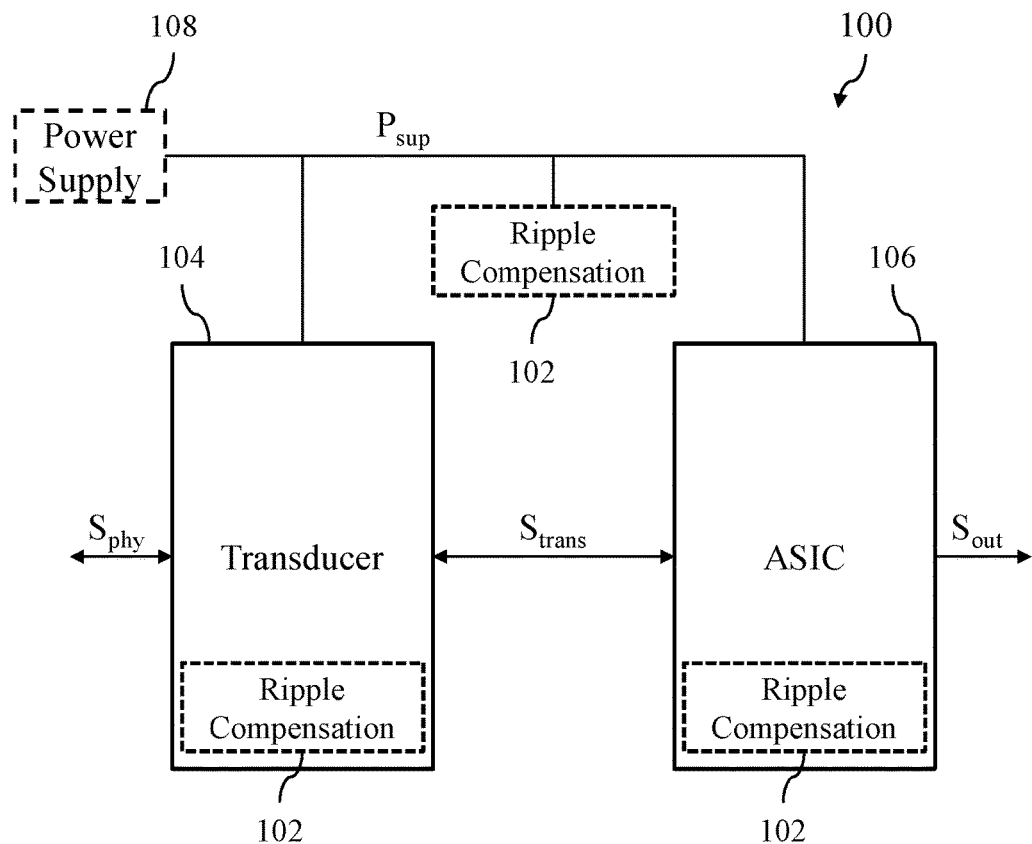
FIG. 1 illustrates a system block diagram of an embodiment transducer system.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely power supply ripple compensation methods for transducer systems. Some of the various embodiments described herein include MEMS transducer systems, packaged components, interface circuits for transducer and MEMS transducer systems, power supply signals, power supply variation, thermal crosstalk, power supply ripple compensation, and power supply ripple compensation for MEMS transducer systems. In other embodiments, aspects may also be applied to other applications involving any type of power supply compensation or transducer system according to any fashion as known in the art.

In an effort to increase the functionality and performance of various devices, multiple functional components are included in the same device in various embodiments. For example, various embodiment devices include one or more sensors coupled to one or more integrated circuits (ICs). The one or more sensors may include temperature sensors, microphones, pressure sensors, humidity sensors, gas sensors, accelerometers, gyroscopes, or other sensors. Similarly, the one or more ICs may include clock circuits, bandgap reference circuits, test and calibration circuits, charge pump circuits, biasing circuits, measurement circuits, analog-to-digital converters (ADCs), digital-to-analog converters (DACs), or other circuits. These various functional components, including sensors or integrated circuit components, may be integrated on a single IC or may be provided as separate components attached together, such as in a chip stack or on a printed circuit board (PCB), and incorporated in a single device package. Such embodiments may provide additional functionality within a single package and may lead to cost savings, increased performance, decreased power consumption, and physical space savings, for example.

In such systems, such as a transducer system, where a power supply provides a power supply signal to functional blocks within the system, the power supply signal generally exhibits fluctuations, such as voltage ripple, for example, leading to variations in the power consumption, which causes variation in the amount of thermal energy produced. The inventors have discovered that these fluctuations or variations may produce thermal crosstalk. Specifically, the inventors have discovered that these fluctuations or variations in the power supply signal may lead to the increase or decrease of thermal energy produced by the various components within the system, and that the thermal energy produced may lead to thermal crosstalk between elements within the system. Particularly, the inventors have discovered that small, or large, temperature fluctuations caused by thermal crosstalk occur with various frequency components, that also may include harmonics at additional frequencies. Some elements within the system, such as a sensor, may be sensitive to thermal crosstalk resulting from small, or large, fluctuations in the power supply signal.

According to various embodiments, a power supply ripple compensation system is included in the overall system. The power supply ripple compensation system determines the variation or fluctuation in the power supply signal and generates a compensation signal that reduces thermal crosstalk from such variation or fluctuation. For example, some embodiments include a power supply ripple compensation system that measures a voltage ripple in the power supply signal and generates an auxiliary compensation current that is controlled in order to inversely track the voltage ripple in the power supply signal. Thus, an increase in the voltage of the power supply signal leads to a decrease in the magnitude of the auxiliary compensation current and vice versa. In various embodiments, the variation or fluctuation in the power supply signal is compensated such that fluctuation or variation in the thermal energy produced by the variation or fluctuation in the power supply signal is reduced. Various embodiment systems and methods are described further hereinafter in reference to the figures.

FIG. 1 illustrates a system block diagram of an embodiment transducer system 100 including ripple compensation circuit 102 (which may be included in different configurations in various embodiments, as illustrated), transducer 104, application specific IC (ASIC) 106, and power supply 108. According to various embodiments, transducer system 100 may be a packaged device that includes multiple functional components in a single package. In the illustrated embodiment, transducer system 100 includes multiple functional elements in transducer 104 and ASIC 106. In various embodiments, ASIC 106 may include various components. In particular embodiments, ASIC 106 includes one or more elements from the group including clock circuits, bandgap reference circuits, test and calibration circuits, charge pump circuits, biasing circuits, buffer or amplifier circuits, measurement circuits, analog-to-digital converters (ADCs), or digital-to-analog converters (DACs). Further, transducer 104 may include one or more sensors from the group including temperature sensors, microphones, pressure sensors, humidity sensors, gas sensors, accelerometers, and gyroscopes. Various embodiments may include systems as described in U.S. patent application Ser. No. 14/661,429, filed on Mar. 18, 2015, and entitled "System and Method for an Acoustic Transducer and Environmental Sensor Package," which is incorporated herein by reference in its entirety.

According to various embodiments, ripple compensation circuit 102 is configured to compensate for fluctuation or variation in power supply signal Psup. In such embodiments, ripple compensation circuit 102 determines the value of the fluctuation or variation in power supply signal Psup and inversely controls an auxiliary power consumption element within ripple compensation circuit 102 in order to maintain the total power consumption approximately constant or stable. In various embodiments, ripple compensation circuit 102 receives power supply signal Psup from power supply 108, which may be included in a device package of transducer system 100 or may be provided externally in different embodiments.

According to various embodiments, transducer 104 receives or transmits physical signal Sphy from or into a sensing environment, such as an ambient environment surrounding transducer system 100, which may be provided through a port or opening in the device package. Transducer 104 operates as an interface between the physical domain and the electrical domain. For example, further description is provided in reference to transducer 104 operating as a sensor, but transducer 104 may operate as a signal generation element such as microspeaker, for example, in other embodiments. In embodiments where transducer 104 includes a sensor, transducer 104 receives physical signal Sphy, which may be a sound signal, a pressure signal, or a gas signal, for example, and generates transduced signal Strans, which is in the electrical domain, based on physical signal Sphy. Transduced signal Strans is provided to ASIC 106, which performs additional processing and generates output signal Sout. For example, in some embodiments, ASIC 106 receives transduced signal Strans as an analog signal and provides amplification or analog to digital conversion before providing output signal Sout as a digital output signal.

In various embodiments, ripple compensation circuit 102 is integrated in ASIC 106. In other embodiments, ripple compensation circuit 102 is integrated with transducer 104, which is implemented as a MEMS sensor integrated on a microfabricated die. In alternative embodiments, ripple compensation circuit 102 is included in transducer system 100 as a separate element. In such embodiments, ripple compensation circuit 102 may be provided as a separate circuit component attached to a shared packaged with transducer 104 and ASIC 106. For example, ripple compensation circuit 102, transducer 104, and ASIC 106 are attached to a same printed circuit board (PCB; not shown) in some embodiments.

According to various embodiments, ripple compensation circuit 102 is implemented using an analog circuit. In some embodiments, ripple compensation circuit 102 may include a digital logic state machine, a field programmable gate array (FPGA), or the like, for example. In other embodiments, ripple compensation circuit 102 may include implementation on a microcontroller or the like. In some embodiments, the various components of transducer system 100 (including ripple compensation circuit 102, transducer 104, and ASIC 106) may be implemented on a single IC, such as a system-on-chip (SoC). In other embodiments, the various components of transducer system 100 may be implemented on one or more microfabricated dies that are packaged together, for example using wafer bonding as a chip stack or by attaching each separate microfabricated die to a PCB. According to various embodiments, the components of transducer system 100 are included in a single device package.

Figure 2:
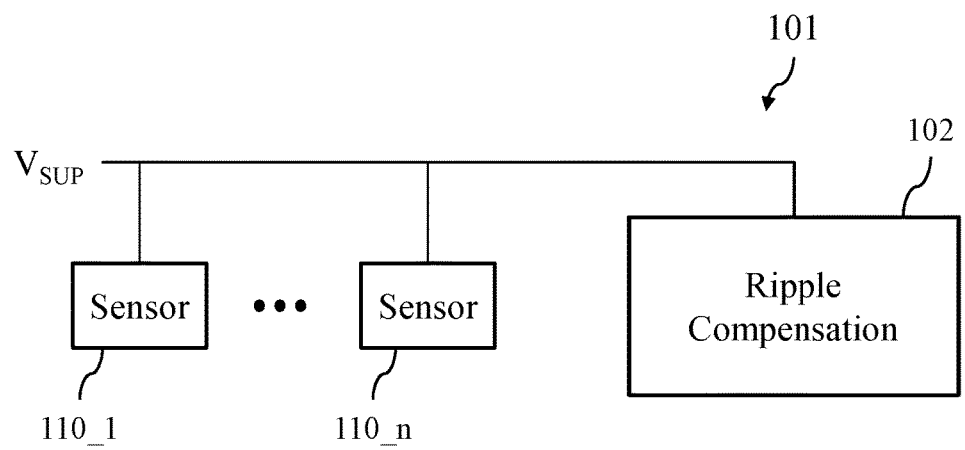
FIG. 2 illustrates a block diagram of a further embodiment transducer system.

FIG. 2 illustrates a block diagram of a further embodiment transducer system 101 including sensors 110_1-110_n and ripple compensation circuit 102. According to various embodiments, transducer system 101 is one implementation of transducer system 100 illustrated at a different level of abstraction. In such embodiments, supply voltage Vsup is provided to each of sensors 110_1-110_n and ripple compensation circuit 102. In various different embodiments, n, the number of sensors 110_1-110_n, may vary to include 1, 2, 3, 4, 5, up to 10, or more sensors, for example.

According to various embodiments, ripple compensation circuit 102 receives supply voltage Vsup, measures voltage ripple of supply voltage Vsup, and generates an auxiliary current consumption internally that is controlled based on the inverse of the voltage ripple of supply voltage Vsup. In such embodiments, numerous other components may be supplied by supply voltage Vsup. Supply voltage Vsup may include voltage level fluctuation or variation generally referred to herein as voltage ripple. The voltage ripple of supply voltage Vsup may lead to variation in the power consumption, leading to variation in thermal energy produced, which in turn leads to thermal crosstalk. Thus, ripple compensation circuit 102 measures the voltage ripple of supply voltage Vsup and generates the auxiliary current consumption internally to compensate for the variation in the power consumption. In other embodiments, ripple compensation circuit 102 measures power variation or fluctuation by measuring another variable, such as supply current, for example.

Figure 3A:
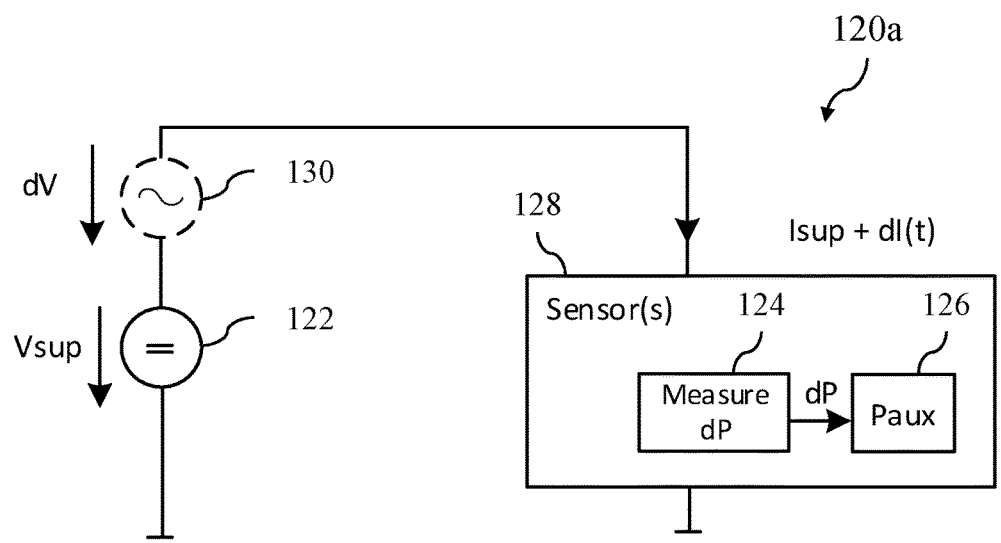
FIGS. 3A and 3B illustrate schematic diagrams of embodiment power supply compensation circuits.
Figure 3B:
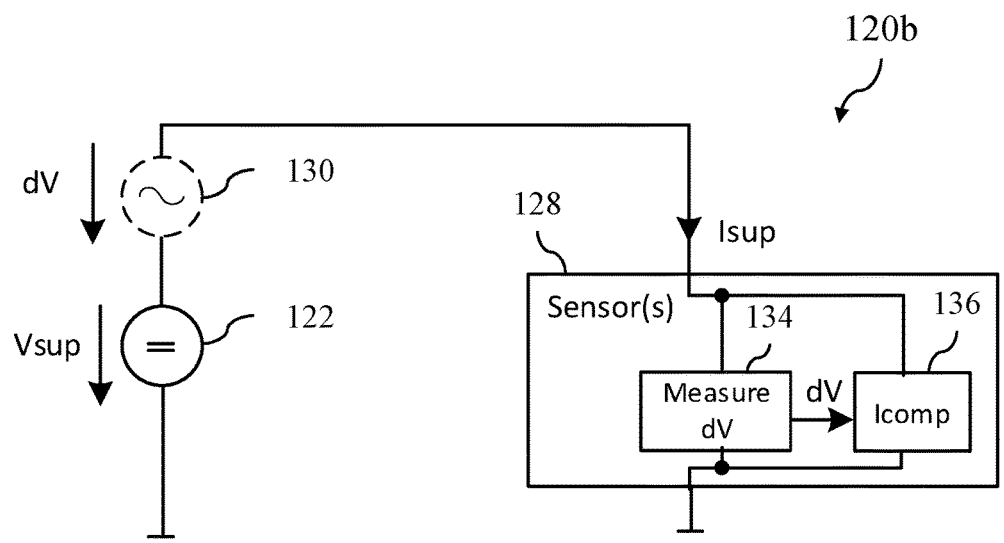

FIGS. 3A and 3B illustrate schematic diagrams of embodiment power supply compensation circuits 120a and 120b, which are embodiment implementations of ripple compensation circuit 102. According to various embodiments, power supply compensation circuit 120a includes power supply 122 and power measurement circuit 124 with auxiliary power compensation circuit 126 in sensor 128. In such embodiments, power supply 122, which provides supply voltage Vsup, may include fluctuation or variation in the power supplied, which is illustrated schematically as dynamic voltage dV provided by variable voltage 130. The variation of fluctuation in the power supplied illustrated as dynamic voltage dV also produces dynamic current dI(t). Thus, sensor 128 receives the sum of supply current Isup and dynamic current dI(t).

According to various embodiments, power measurement circuit 124 measures the power variation or fluctuation of the power signal received from power supply 122 (with variable voltage 130), which includes a current equal to the sum of supply current Isup and dynamic current dI(t) and a voltage equal to the sum of supply voltage Vsup and dynamic voltage dV. Based on measuring the variation or fluctuation of the power signal, indicated by dynamic power dP, received from power supply 122 (with variable voltage 130), auxiliary power compensation circuit 126 generates auxiliary power compensation Paux that is controlled inversely based on dynamic power dP. In such embodiments, as the power signal received from power supply 122 (with variable voltage 130) varies or fluctuates, auxiliary power compensation Paux is regulated inversely in order to maintain the total power consumption at a constant or stable level.

According to various embodiments, power supply compensation circuit 120b is similar to power supply compensation circuit 120a, but includes a specific embodiment approach to the power supply compensation. In such embodiments, voltage ripple measurement circuit 134 is included with auxiliary current compensation circuit 136 in sensor 128. In some embodiments, the current supplied to sensor 128 is approximately constant. Thus, FIG. 3B omits dynamic current dI(t) for illustrative purposes and for ease of analysis. In such embodiments, voltage ripple measurement circuit 134 and auxiliary current compensation circuit 136 receive a power supply signal from power supply 122 (with variable voltage 130) including supply current Isup with a voltage that is the sum of supply voltage Vsup and dynamic voltage dV. Voltage ripple measurement circuit 134 measures dynamic voltage dV as the voltage ripple and provides the measurement result to auxiliary current compensation circuit 136. Based on the measurement of dynamic voltage dV, auxiliary current compensation circuit 136 generates and regulates auxiliary compensation current Icomp inversely.

In various embodiments, auxiliary compensation current Icomp includes a DC current (Icomp_DC) and a variable current (dIcomp) that is controlled according to the inverse of dynamic voltage dV determined by voltage ripple measurement circuit 134. In such embodiments, DC current Icomp_DC is a constant current value while variable current dIcomp is used to compensate for the variation or fluctuation in power supply 122 (with variable voltage dV 130). Thus, in some embodiments, in order to compensate for variation or fluctuation in power supply 122 (with variable voltage 130), variable current dIcomp of compensation current Icomp may be controlled according to the following expression, $$dV \cdot I_{sup} + dIcomp \cdot V_{sup} = 0.$$

In such embodiments, supply current Isup and supply voltage Vsup are considered approximately constant or stable, dynamic voltage dV is small by comparison to Vsup and is measured by voltage ripple measurement circuit 134, and variable current dIcomp is controlled in auxiliary current compensation circuit 136. Thus, rearranging the above expression, variable current dIcomp is controlled in some embodiments according to the expression, $$dI_{comp} = \frac{dV \cdot I_{sup}}{V_{sup}}.$$

In various embodiments, sensor 128 may be implemented as described hereinabove in reference to transducer system 100 in FIG. 1. Details of sensor 128 are omitted in reference to FIGS. 3A and 3B in order to provide clear explanation of the function of power supply compensation circuits 120a and 120b. In various embodiments, multiple additional components may be included in sensor 128.

Power supply compensation circuit 120b in FIG. 3B is an embodiment implementation of a power supply compensation system using a variable compensation current that is controlled based on an inverse of a determined power supply voltage variation (e.g., dynamic voltage dV). In additional embodiments, power supply compensation is implemented with a controlled power dissipation that is controlled based on an inverse of a determined variation or fluctuation of the power supply consumption (e.g., dynamic power dP), as described hereinabove in reference to power supply compensation circuit 120a in FIG. 3A.

Figure 4:
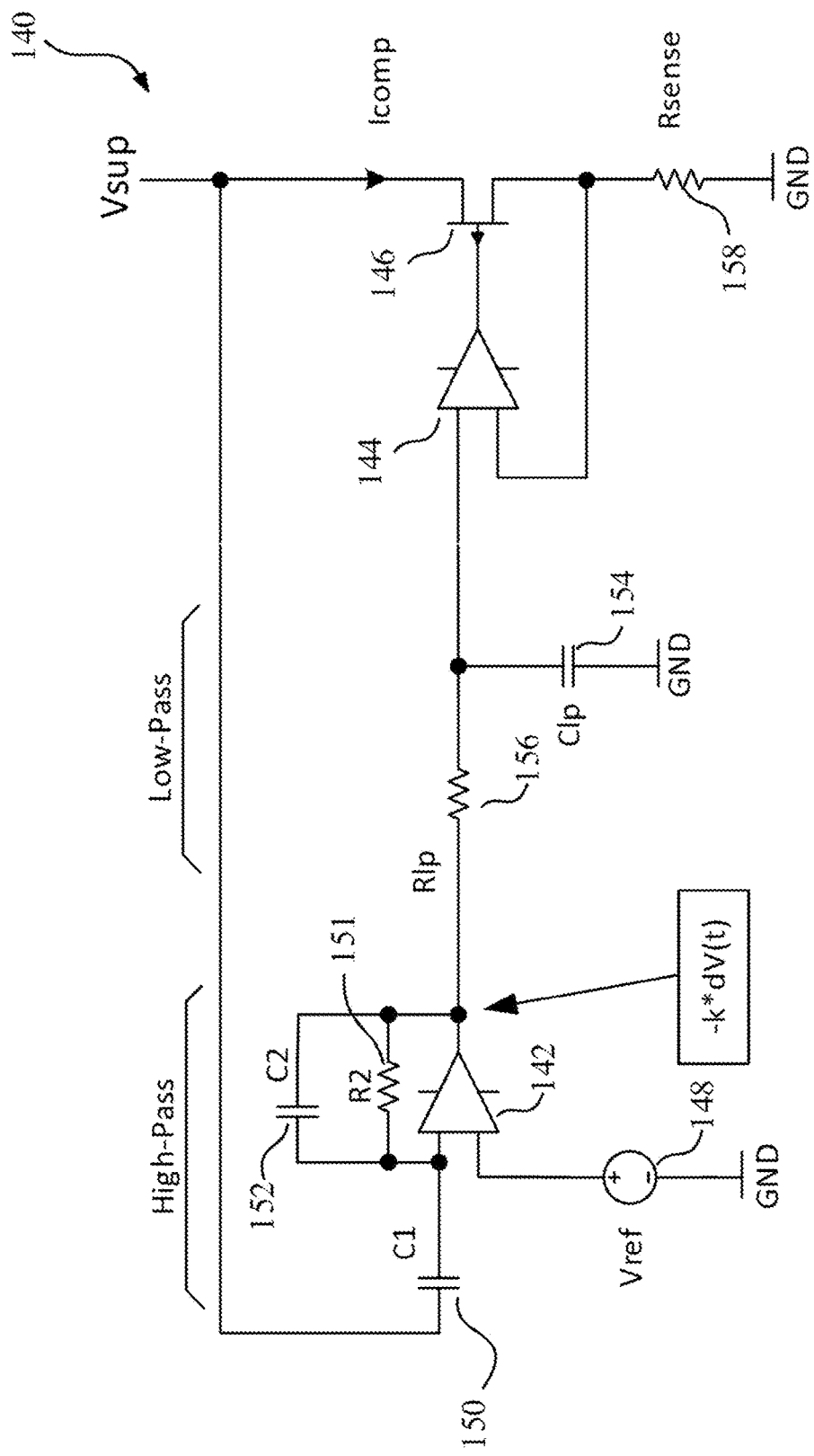
FIG. 4 illustrates a circuit schematic of an embodiment power supply compensation circuit.

FIG. 4 illustrates a circuit schematic of an embodiment power supply compensation circuit 140, which may be an implementation of ripple compensation circuit 102, power supply compensation circuit 120a, or power supply compensation circuit 120b, as described hereinabove in reference to FIGS. 1, 2, 3A, and 3B. According to various embodiments, power supply compensation circuit 140 includes sense opamp 142, drive opamp 144, compensation transistor 146, and reference voltage source 148. Sense opamp 142 operates to measure or sense dynamic voltage dV through capacitor 150 (with capacitance C1), where feedback is provided for sense opamp 142 through capacitor 152 (with capacitance C2). DC stabiliziation can be achieved by a feedback resistor 151 (with resistance R2). An operating point at the output of the sense amplifier 142 equal to reference voltage source 148 (with reference voltage Vref) is obtained. In such embodiments, the high-frequency gain k of sense opamp 142 is set by the capacitance ratio between capacitor 150 and capacitor 152, i.e., k=C1/C2. In some embodiments, sense opamp 142 may also be inverting, which produces an output signal at the output of the sense opamp that is equal to the negative product of gain k and dynamic voltage dV, i.e., −k·dV, as shown in FIG. 4. Sense opamp 142 may be referred to as a sense amplifier in various embodiments. The frequency response of the sense amplifier has a high-pass characteristic determined by capacitors 150 and 152 and resistor 151.

According to various embodiments, by capacitively coupling sense opamp 142 to receive supply voltage Vsup and adding a low-pass filter including capacitor 154 (with capacitance Clp) and resistor 156 (with resistance Rlp), a frequency filtering may be performed that removes or reduces DC components and selects a relevant bandpass. Thus, in some embodiments, capacitor 150, capacitor 152, resistor 151, sense opamp 142, capacitor 154, and resistor 156 are configured to provide a high pass cut-off frequency and a low pass cut-off frequency. In particular embodiments, the high pass cut-off frequency is determined by capacitors 150 and 152 as well as resistor 151, while the low pass cut-off frequency is determined by capacitor 154 and resistor 156.

In various embodiments, based on the input, sense opamp 142 generates, at the output, a drive signal that is fed through the RC circuit formed by capacitor 154 and resistor 156 to the input of opamp 144. Based on the input, drive opamp 144 generates, at the output, a drive signal for compensation transistor 146. In such embodiments, drive opamp 144 receives feedback from the output of compensation transistor 146, which is coupled in series with resistor 158 (with resistance Rsense). According to various embodiments, the drive signal for compensation transistor 146 provided by drive opamp 144 is inversely proportional to dynamic voltage dV.

According to various embodiments, based on the drive signal from drive opamp 144, compensation transistor 146 and resistor 158 conduct auxiliary compensation current Icomp. As described hereinabove in reference to FIGS. 3A and 3B, auxiliary compensation current Icomp may include DC current Icomp_DC and variable current dIcomp, where DC current Icomp_DC is maintained at a substantially constant or stable value while variable current dIcomp is controlled to compensate for fluctuation or variation of the power supply signal as measured through dynamic voltage dV. In particular embodiments, in order to satisfy the expression described hereinabove in reference to FIG. 3B, resistance Rsense may be set according to the following expressions, $$dV \cdot I_{sup} + dI_{comp} \cdot V_{sup} = dV \cdot I_{sup} - \frac{dV \cdot k}{R_{sense}} \cdot V_{sup} = 0 \rightarrow R_{sense} = k \cdot \frac{V_{sup}}{I_{sup}}.$$

In such embodiments, variable current dIcomp, which is generated and controlled to flow through compensation transistor 146 and resistor 158, compensates for variation or fluctuation in the power supply, and thus the power consumption, as measured through dynamic voltage dV.

Figure 5:
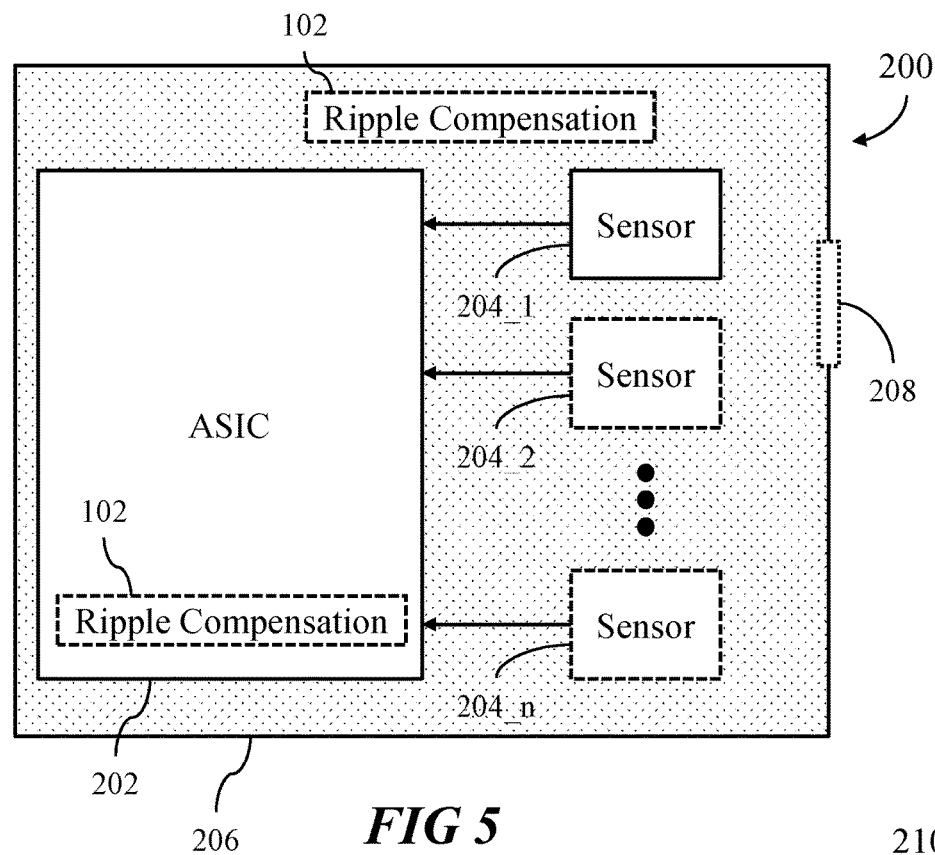
FIG. 5 illustrates a schematic diagram of an embodiment packaged transducer system.

FIG. 5 illustrates a schematic diagram of an embodiment packaged transducer system 200 including ripple compensation circuit 102, ASIC 202, sensors 204_1-204_n, and package 206. According to various embodiments, ripple compensation circuit 102 is integrated on a same microfabricated die with ASIC 202. In other embodiments, ripple compensation circuit 102 is attached to package 206 as a separate circuit component. In such embodiments, ripple compensation circuit 102 may be a separate microfabricated die attached to package 206, may be implemented using discrete components, or may be formed directly in package 206. In various embodiments, package 206 includes a structural support for coupling sensors 204_1-204_n, ASIC 202, and ripple compensation circuit 102 together, such as a PCB or the like. In other embodiments, package 206 is implemented as a chip stack. In other embodiments, ASIC 202, sensors 204_1-204_n, and ripple compensation circuit 102 may be integrated on a shared substrate, such as a semiconductor die. Package 206 may also include a lid or case. For example, package 206 may include a metal or plastic cover attached to a PCB.

In various embodiments, environmental port 208 is included in package 206. In such embodiments, environmental port 208 provides physical communication between an ambient environment surrounding packaged transducer system 200 and sensors 204_1-204_n inside package 206. In some embodiments, environmental port 208 allows fluidic communication between the ambient environment and sensors 204_1-204_n. For example, environmental port 208 may allow sound waves propagating through the fluidic medium (such as air), pressure levels of the fluidic medium (such as air), or different gases (with various concentrations) to reach sensors 204_1-204_n. In some particular embodiments, environmental port 208 is waterproofed to be liquid impermeable and gas permeable.

According to various embodiments, sensors 204_1-204_n may include different numbers of sensors of various sensor types as described hereinabove in reference to transducer 104 and sensors 110_1-110_n in FIG. 1 and FIG. 2, respectively.

Figure 6:
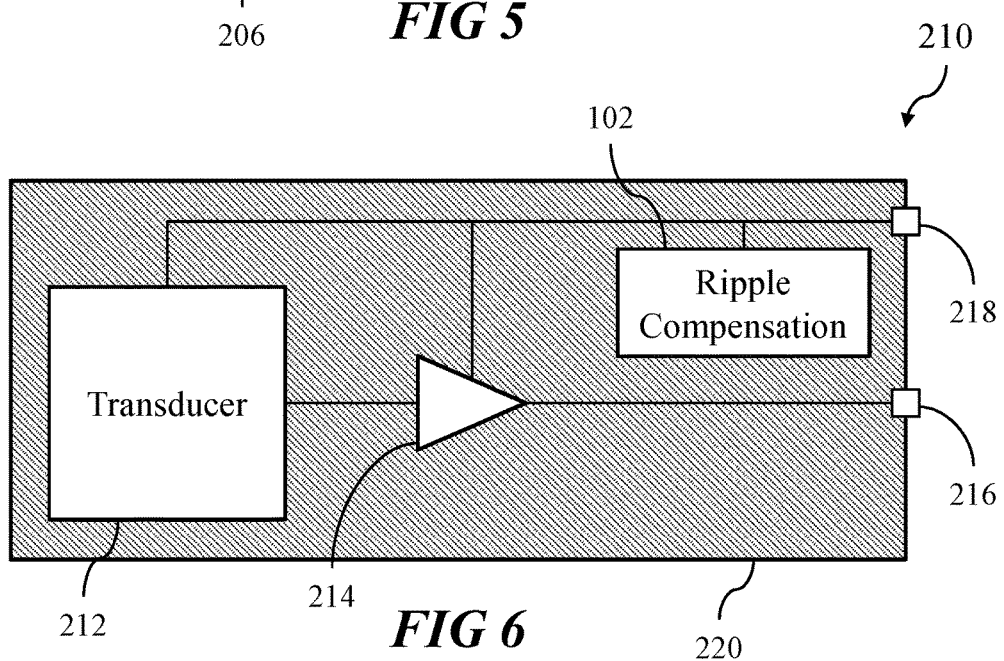
FIG. 6 illustrates a schematic diagram of an embodiment transducer component.

FIG. 6 illustrates a schematic diagram of an embodiment transducer component 210. According to various embodiments, transducer component 210 is a microfabricated transducer system formed on a shared substrate 220. In various embodiments, shared substrate 220 is a microfabricated substrate, such as a semiconductor die, that includes transducer 212, amplifier 214, and ripple compensation circuit 102 as microfabricated elements. For example, transducer 212 is a MEMS transducer as described hereinabove in reference to transducer 104 or sensors 110_1-110_n in FIG. 1 and FIG. 2, respectively, that is formed on shared substrate 220 as a shared semiconductor die with amplifier 214 and ripple compensation circuit 102 in a combination MEMS-CMOS process, or the like. In other embodiments, shared substrate 220 is a polymer based substrate that includes separately microfabricated elements including transducer 212, amplifier 214, and ripple compensation circuit 102.

According to various embodiments, terminal 218 of transducer component 210 receives a power supply signal and terminal 216 of transducer component 210 provides a signal output based on operation of transducer 212. In the illustrated embodiment, amplifier 214 is configured to operate with transducer 212 as a sensor. In alternative embodiments, transducer 212 may operate to generate physical signals, such as for a microspeaker, for example. In some alternative embodiments, amplifier 214 is omitted. In another embodiment, amplifier 214 may be replaced by an analog-to-digital converter with or without post-processing logic and terminal 216 will be a digital interface.

Figure 7:
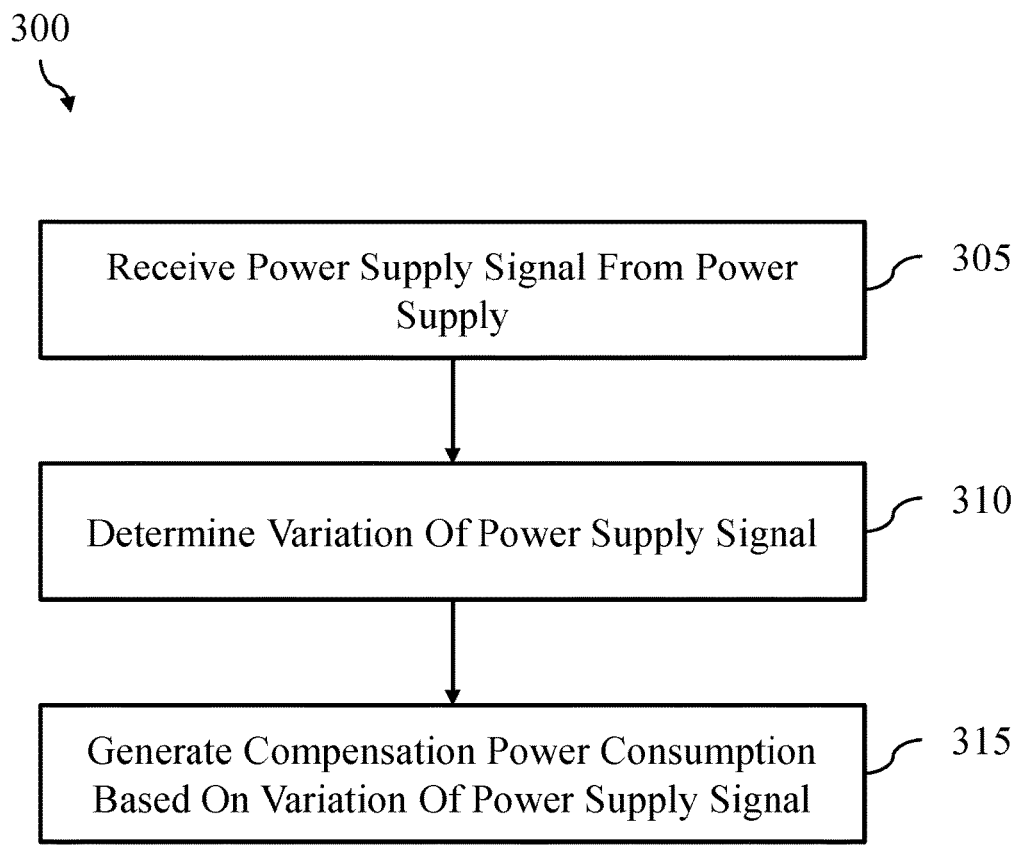
FIG. 7 illustrates a block diagram of an embodiment method of power compensation.

FIG. 7 illustrates a block diagram of an embodiment method of power compensation 300 including steps 305, 310, and 315. According to various embodiments, step 305 includes receiving a power supply signal from a power supply. In such embodiments, the power supply signal may be provided with a current value and a voltage value, yielding a corresponding power. The power level of the power supply signal may have variation or fluctuation. For example, the current value, the voltage value, or both may have some fluctuation or variation during normal operation. Step 310 includes determining a variation of the power supply signal.

According to various embodiments, step 315 includes generating a compensation power consumption based on the variation of the power supply signal. In such embodiments, the compensation power consumption is controlled inversely with the variation of the power supply signal that is determined in step 310. In particular embodiments, the compensation power consumption may be an auxiliary compensation current for example. Further, the variation of the power supply signal may be a voltage variation signal. Thus, in some particular embodiments, an auxiliary compensation current is controlled inversely based on a voltage variation signal determined from the power supply signal.

In various embodiments, method of power compensation 300 may include additional steps or modification and rearrangement of steps.

According to an embodiment, a power compensation circuit is configured to be coupled to a power supply. The power compensation circuit includes a measurement circuit and a compensation circuit. The measurement circuit is configured to receive a power supply signal from the power supply, and determine a variation of the power supply signal. The compensation circuit is coupled to the measurement circuit and configured to generate a compensation power consumption based on the variation of the power supply signal, where the compensation power consumption is controlled inversely with the variation of the power supply signal.

In various embodiments, determining a variation of the power supply signal includes determining a voltage variation of the power supply signal, and generating a compensation power consumption based on the variation of the power supply signal includes generating an auxiliary current based on the voltage variation of the power supply signal, where the auxiliary current is controlled inversely with the voltage variation of the power supply signal. In some embodiments, the measurement circuit includes a sense amplifier stage coupled to receive the power supply signal, and the compensation circuit includes a drive stage coupled to an output of the sense amplifier stage and a load stage having a control terminal coupled to an output of the drive stage, where the load stage is configured to conduct the auxiliary current.

In various embodiments, the sense amplifier stage includes a sense amplifier capacitively coupled to receive the variation of the power supply signal and having capacitive and resistive feedback and a reference circuit coupled to an input of the sense amplifier stage, where the reference circuit provides a DC operating point. In such embodiments, the drive stage includes an input filter coupled to the output of the sense amplifier stage and a driver having an input coupled to the input filter and an output coupled to the control terminal of the load stage through the output of the drive stage, and the load stage includes a load conduction circuit controlled by the control terminal and having a conduction path coupled to receive the power supply signal and configured to conduct the auxiliary current.

In various embodiments, the load stage is coupled in parallel with a sensor being supplied by the power supply signal. In some embodiments, the power supply signal includes a DC current IDC and a DC voltage VDC, the voltage variation of the power supply signal is expressed as dynamic voltage variation dV, and the auxiliary current, dIcomp, is controlled by the compensation circuit according to an expression dIcomp=−(dV·IDC)÷VDC.

According to an embodiment, a method of power compensation includes receiving a power supply signal from a power supply, determining a variation of the power supply signal, and generating a compensation power consumption based on the variation of the power supply signal, where the compensation power consumption is controlled inversely with the variation of the power supply signal.

In various embodiments, determining a variation of the power supply signal include determining a voltage variation of the power supply signal, and generating a compensation power consumption based on the variation of the power supply signal includes generating an auxiliary current based on the voltage variation of the power supply signal, where the auxiliary current is controlled inversely with the voltage variation of the power supply signal. In some embodiments, determining a voltage variation of the power supply signal includes measuring the voltage variation using a sense amplifier stage coupled to receive the power supply signal, and generating an auxiliary current based on the voltage variation of the power supply signal includes generating a drive signal at a drive stage coupled to an output of the sense amplifier stage, supplying the drive signal to a control terminal of a load stage, and conducting the auxiliary current in the load stage based on the drive signal.

In various embodiments, measuring the voltage variation using a sense amplifier stage includes capacitively receiving the power supply signal at a sense amplifier, providing capacitive and resistive feedback for the sense amplifier, and receiving a reference voltage at a sense amplifier input. In such embodiments, generating a drive signal includes receiving the output of the sense amplifier stage through an input filter and generating the drive signal at a driver based on the output of the sense amplifier. In further such embodiments, conducting the auxiliary current in the load stage includes controlling, with the drive signal, a conduction path of a load transistor coupled in series with a load resistor, where the conduction path is coupled to receive the power supply signal and configured to conduct the auxiliary current.

In various embodiments, the method further includes supplying the power supply signal to a sensor coupled in parallel with the load stage. In some embodiments, the power supply signal includes a DC current IDC and a DC voltage VDC, the voltage variation of the power supply signal is expressed as dynamic voltage variation dV, and the auxiliary current, dIcomp, is controlled by drive signal according to an expression dIcomp=−(dV·IDC)÷VDC.

According to an embodiment, a device includes a transducer configured to receive a power supply signal and a sense and compensation circuit. The sense and compensation circuit is configured to receive the power supply signal, determine a voltage variation of the power supply signal, and generate an auxiliary current based on the voltage variation of the power supply signal, where the auxiliary current is controlled inversely with the voltage variation of the power supply signal.

In various embodiments, the transducer includes a microelectromechanical systems (MEMS) sensor. In some embodiments, the device further includes a device package encasing the transducer and the sense and compensation circuit, where the device package includes an environmental port configured to allow fluidic transport between an ambient environment and the transducer.

In various embodiments, the sense and compensation circuit is formed on a first microfabricated die and the MEMS sensor is formed on a second microfabricated die, where the first microfabricated die is separate from the second microfabricated die. In some embodiments, the MEMS sensor includes a plurality of MEMS sensors. In other embodiments, the first microfabricated die includes a plurality of transducers. In particular embodiments, the plurality of transducers includes at least one of a temperature sensor, a humidity sensor, a gas sensor, or a pressure sensor.

In various embodiments, the sensor and compensation circuit is integrated on a same microfabricated die as the MEMS sensor. In some embodiments, the sense and compensation circuit includes a sense amplifier stage coupled to receive the power supply signal, a drive stage coupled to an output of the sense amplifier stage, and a load stage having a control terminal coupled to an output of the drive stage, where the load stage is configured to conduct the auxiliary current.

In various embodiments, the sense amplifier stage includes a sense amplifier capacitively coupled to receive the voltage variation of the power supply signal, the sense amplifier having capacitive and resistive feedback and receiving a reference voltage at a sense amplifier input. In such embodiments, the drive stage includes an input filter coupled to the output of the sense amplifier stage and a driver having an input coupled to the input filter and an output coupled to the control terminal of the load stage through the output of the drive stage. In further such embodiments, the load stage includes a load conduction circuit controlled by the control terminal and having a conduction path coupled to receive the power supply signal and configured to conduct the auxiliary current. In some embodiments, the power supply signal includes a DC current IDC and a DC voltage VDC, the voltage variation of the power supply signal is expressed as dynamic voltage variation dV, and the auxiliary current, dIcomp, is controlled by the sense and compensation circuit according to an expression dIcomp=−(dV·IDC)÷VDC.

According to various embodiments described herein, advantages may include transducer systems with reduced impact from thermal crosstalk caused by power supply variation or fluctuation. In particular embodiments, advantages may include reduced frequency components, or harmonics, of thermal crosstalk in frequency bands of sensitivity for a sensor in the embodiment system. In some embodiments, advantages may include improved power supply rejection in frequency areas affected by thermal crosstalk, e.g., frequencies below about 200 Hz.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power compensation circuit configured to be coupled to a power supply, the power compensation circuit comprising:
a measurement circuit configured to
receive a power supply signal from the power supply, and
determine a variation of the power supply signal; and
a compensation circuit coupled to the measurement circuit and configured to generate a compensation power consumption based on the variation of the power supply signal, the compensation power consumption being controlled inversely with the variation of the power supply signal.

2. The power compensation circuit of claim 1, wherein determining a variation of the power supply signal comprises determining a voltage variation of the power supply signal; and
generating a compensation power consumption based on the variation of the power supply signal comprises generating an auxiliary current based on the voltage variation of the power supply signal, the auxiliary current being controlled inversely with the voltage variation of the power supply signal.

3. The power compensation circuit of claim 2, wherein the measurement circuit comprises a sense amplifier stage coupled to receive the power supply signal; and
the compensation circuit comprises
a drive stage coupled to an output of the sense amplifier stage, and
a load stage having a control terminal coupled to an output of the drive stage, the load stage configured to conduct the auxiliary current.

4. The power compensation circuit of claim 3, wherein:
the sense amplifier stage comprises a sense amplifier capacitively coupled to receive the variation of the power supply signal and having capacitive and resistive feedback and a reference circuit coupled to an input of the sense amplifier stage, the reference circuit providing a DC operating point;
the drive stage comprises
an input filter coupled to the output of the sense amplifier stage, and
a driver having an input coupled to the input filter and an output coupled to the control terminal of the load stage through the output of the drive stage; and
the load stage comprises a load conduction circuit controlled by the control terminal and having a conduction path coupled to receive the power supply signal and configured to conduct the auxiliary current.

5. The power compensation circuit of claim 3, wherein the load stage is coupled in parallel with a sensor being supplied by the power supply signal.

6. The power compensation circuit of claim 2, wherein
the power supply signal comprises a DC current IDC and a DC voltage VDC,
the voltage variation of the power supply signal is expressed as dynamic voltage variation dV, and
the auxiliary current, dIcomp, is controlled by the compensation circuit according to an expression dIcomp=−(dV·IDC)÷VDC.

7. A method of power compensation, the method comprising:
receiving a power supply signal from a power supply;
determining a variation of the power supply signal; and
generating a compensation power consumption based on the variation of the power supply signal, the compensation power consumption being controlled inversely with the variation of the power supply signal.

8. The method of claim 7, wherein
determining a variation of the power supply signal comprises determining a voltage variation of the power supply signal; and
generating a compensation power consumption based on the variation of the power supply signal comprises generating an auxiliary current based on the voltage variation of the power supply signal, the auxiliary current being controlled inversely with the voltage variation of the power supply signal.

9. The method of claim 8, wherein
determining a voltage variation of the power supply signal comprises measuring the voltage variation using a sense amplifier stage coupled to receive the power supply signal; and
generating an auxiliary current based on the voltage variation of the power supply signal comprises
generating a drive signal at a drive stage coupled to an output of the sense amplifier stage,
supplying the drive signal to a control terminal of a load stage, and
conducting the auxiliary current in the load stage based on the drive signal.

10. The method of claim 9, wherein:
measuring the voltage variation using a sense amplifier stage comprises:
capacitively receiving the power supply signal at a sense amplifier,
providing capacitive and resistive feedback for the sense amplifier, and
receiving a reference voltage at a sense amplifier input;
generating a drive signal comprises
receiving the output of the sense amplifier stage through an input filter, and
generating the drive signal at a driver based on the output of the sense amplifier; and
conducting the auxiliary current in the load stage comprises controlling, with the drive signal, a conduction path of a load transistor coupled in series with a load resistor, the conduction path coupled to receive the power supply signal and configured to conduct the auxiliary current.

11. The method of claim 9, further comprising supplying the power supply signal to a sensor coupled in parallel with the load stage.

12. The method of claim 8, wherein
the power supply signal comprises a DC current IDC and a DC voltage VDC,
the voltage variation of the power supply signal is expressed as dynamic voltage variation dV, and
the auxiliary current, dIcomp, is controlled by drive signal according to an expression dIcomp=−(dV·IDC)÷VDC.

13. A device comprising:
a transducer configured to receive a power supply signal; and
a sense and power compensation circuit configured to:
receive the power supply signal,
determine a variation of the power supply signal, and
generate a compensation power consumption based on the variation of the power supply signal, the compensation power consumption being controlled inversely with the variation of the power supply signal.

14. The device of claim 13, wherein the transducer comprises a microelectromechanical systems (MEMS) sensor.

15. The device of claim 14, further comprising a device package encasing the transducer and the sense and power compensation circuit, wherein the device package comprises an environmental port configured to allow fluidic transport between an ambient environment and the transducer.

16. The device of claim 15, wherein the sense and power compensation circuit is formed on a first microfabricated die and the MEMS sensor is formed on a second microfabricated die, the first microfabricated die being separate from the second microfabricated die.

17. The device of claim 16, wherein the MEMS sensor comprises a plurality of MEMS sensors.

18. The device of claim 16, wherein the first microfabricated die comprises a plurality of transducers.

19. The device of claim 18, wherein the plurality of transducers includes at least one of a temperature sensor, a humidity sensor, a gas sensor, or a pressure sensor.

20. The device of claim 14, wherein the sensor and compensation circuit is integrated on a same microfabricated die as the MEMS sensor.

21. The device of claim 13, wherein the sense and power compensation circuit comprises:
a sense amplifier stage coupled to receive the power supply signal;
a drive stage coupled to an output of the sense amplifier stage; and
a load stage having a control terminal coupled to an output of the drive stage, the load stage configured to conduct an auxiliary current as the compensation power consumption.

22. The device of claim 21, wherein:
the sense amplifier stage comprises a sense amplifier capacitively coupled to receive the variation of the power supply signal, the sense amplifier having capacitive and resistive feedback and receiving a reference voltage at a sense amplifier input;
the drive stage comprises
an input filter coupled to the output of the sense amplifier stage, and
a driver having an input coupled to the input filter and an output coupled to the control terminal of the load stage through the output of the drive stage; and
the load stage comprises a load conduction circuit controlled by the control terminal and having a conduction path coupled to receive the power supply signal and configured to conduct the auxiliary current.

23. The device of claim 13, wherein
the power supply signal comprises a DC current IDC and a DC voltage VDC,
the variation of the power supply signal is expressed as dynamic voltage variation dV, and
the compensation power consumption comprises an auxiliary current, dIcomp, that is controlled by the sense and power compensation circuit according to an expression dIcomp=−(dV·IDC)÷VDC.

* * * * *